US010031424B2

(12) United States Patent
Tabirian et al.

(10) Patent No.: US 10,031,424 B2
(45) Date of Patent: Jul. 24, 2018

(54) FABRICATION OF HIGH EFFICIENCY, HIGH QUALITY, LARGE AREA DIFFRACTIVE WAVEPLATES AND ARRAYS

(71) Applicants: The United States of America as Represented by the Secretary of the Army, Washington, DC (US); Beam Engineering for Advanced Measurements Co., Orlando, FL (US)

(72) Inventors: Nelson V. Tabirian, Winter Park, FL (US); Sarik R. Nersisyan, Maitland, FL (US); Brian R. Kimball, Shrewsbury, MA (US); Diane M. Steeves, Franklin, MA (US)

(73) Assignees: Beam Engineering for Advanced Measurements Co., Orlando, FL (US); The United States of America as Represented by the Secretary of the Army, Natick, MA (US)

( * ) Notice: Subject to any disclaimer, the term of this patent is extended or adjusted under 35 U.S.C. 154(b) by 0 days.

(21) Appl. No.: 14/810,569

(22) Filed: Jul. 28, 2015

(65) Prior Publication Data

US 2016/0026092 A1    Jan. 28, 2016

Related U.S. Application Data

(63) Continuation of application No. 13/860,934, filed on Apr. 11, 2013, now abandoned, which is a (Continued)

(51) Int. Cl.
G03H 1/04    (2006.01)
G03H 1/02    (2006.01)
(Continued)

(52) U.S. Cl.
CPC ....... *G03F 7/70191* (2013.01); *G02B 5/3083* (2013.01); *G02B 5/32* (2013.01);
(Continued)

(58) Field of Classification Search
None
See application file for complete search history.

(56) References Cited

U.S. PATENT DOCUMENTS 2,435,616 A    2/1948  Vittum
3,721,486 A    3/1973  Bramley
(Continued)

FOREIGN PATENT DOCUMENTS

EP    1970734    9/2008
EP    2088456    12/2009
(Continued)

OTHER PUBLICATIONS

Escuti et al., "Polarization-independent LC microdisplays using liquid crystal polarization gratings" A viable solution ?"Presentation slide" Jul. 2008 at ILCC'08 (30 pages).*
(Continued)

*Primary Examiner* — Martin J Angebranndt
(74) *Attorney, Agent, or Firm* — Brian S. Steinberger; Law Offices of Brian S. Steinberger, P.A.

(57) ABSTRACT

The objective of the present invention is providing a method for fabricating high quality diffractive waveplates and their arrays that exhibit high diffraction efficiency over large area, the method being capable of inexpensive large volume production. The method uses a polarization converter for converting the polarization of generally non-monochromatic and partially coherent input light beam into a pattern of periodic spatial modulation at the output of said polarization converter. A substrate carrying a photoalignment layer is exposed to said polarization modulation pattern and is
(Continued)

coated subsequently with a liquid crystalline material. The high quality diffractive waveplates of the present invention are obtained when the exposure time of said photoalignment layer exceeds by generally an order of magnitude the time period that would be sufficient for producing homogeneous orientation of liquid crystalline materials brought in contact with said photoalignment layer. Compared to holographic techniques, the method is robust with respect to mechanical noises, ambient conditions, and allows inexpensive production via printing while also allowing to double the spatial frequency of optical axis modulation of diffractive waveplates.

10 Claims, 6 Drawing Sheets

Related U.S. Application Data continuation of application No. 12/662,525, filed on Apr. 21, 2010, now abandoned.

(51) Int. Cl.
G03H 1/18 (2006.01)
G02B 5/30 (2006.01)
G02B 5/32 (2006.01)
G03F 7/20 (2006.01)

(52) U.S. Cl.
CPC ....... *G03F 7/20* (2013.01); *G03H 2001/0439* (2013.01); *G03H 2260/51* (2013.01)

(56) References Cited

U.S. PATENT DOCUMENTS

| | | | |
|---|---|---|---|
| 3,897,136 A | 7/1975 | Bryngdahl | |
| 4,160,598 A | 7/1979 | Firester et al. | |
| 4,301,023 A | 11/1981 | Schuberth | |
| 4,956,141 A | 9/1990 | Allen | |
| 4,983,332 A | 1/1991 | Hahn | |
| 5,032,009 A | 7/1991 | Gibbons | |
| 5,042,950 A | 8/1991 | Salmon, Jr. | |
| 5,047,847 A | 9/1991 | Toda | |
| 5,100,231 A | 3/1992 | Sasnett et al. | |
| 5,142,411 A | 8/1992 | Fiala | |
| 5,218,610 A | 6/1993 | Dixon | |
| 5,325,218 A | 6/1994 | Willett | |
| 5,446,596 A | 8/1995 | Mostrorocco | |
| 5,621,525 A | 4/1997 | Vogeler et al. | |
| 5,895,422 A | 4/1999 | Hauber | |
| 5,903,330 A | 5/1999 | Funschilling | |
| 5,989,758 A | 11/1999 | Komatsu | |
| 6,107,617 A | 8/2000 | Love et al. | |
| 6,139,147 A | 10/2000 | Zhang | |
| 6,191,880 B1 | 2/2001 | Schuster | |
| 6,219,185 B1 | 4/2001 | Hyde | |
| 6,320,663 B1 | 11/2001 | Ershov | |
| 6,373,549 B1 | 4/2002 | Tombling | |
| 6,452,145 B1 | 9/2002 | Graves et al. | |
| 6,551,531 B1 | 4/2003 | Ford | |
| 6,678,042 B2 | 1/2004 | Tabirian et al. | |
| 6,728,049 B1 | 4/2004 | Tabirian et al. | |
| 6,792,028 B2 | 9/2004 | Cook | |
| 7,048,619 B2 | 5/2006 | Park | |
| 7,094,304 B2 | 8/2006 | Nystrom | |
| 7,095,772 B1 | 8/2006 | Delfyett et al. | |
| 7,196,758 B2 | 3/2007 | Crawford | |
| 7,319,566 B2 | 1/2008 | Prince | |
| 7,324,286 B1 | 1/2008 | Glebov | |
| 7,450,213 B2 | 11/2008 | Kim et al. | |
| 7,764,426 B2 | 7/2010 | Lipson | |
| 8,045,130 B2 | 10/2011 | Son | |
| 8,077,388 B2 | 12/2011 | Gerton | |
| 8,264,623 B2 | 9/2012 | Marrucci | |
| 8,520,170 B2 | 8/2013 | Escuti | |
| 8,643,822 B2 | 2/2014 | Tan et al. | |
| 8,982,313 B2 | 3/2015 | Escuti et al. | |
| 9,541,772 B2 | 1/2017 | De Sio et al. | |
| 9,557,456 B2 | 1/2017 | Tabirian et al. | |
| 9,592,116 B2 | 3/2017 | De Sio et al. | |
| 9,617,205 B2 | 4/2017 | Tabirian et al. | |
| 9,658,512 B2 | 5/2017 | Tabirian et al. | |
| 9,715,048 B2 | 7/2017 | Tabirian et al. | |
| 9,753,193 B2 | 9/2017 | Tabirian et al. | |
| 9,976,911 B1 | 5/2018 | Tabirian et al. | |
| 9,983,479 | 5/2018 | Tabirian et al. | |
| 2001/0002895 A1 | 6/2001 | Kawano | |
| 2001/0018612 A1 | 8/2001 | Carson et al. | |
| 2001/0030720 A1 | 10/2001 | Ichihashi | |
| 2002/0027624 A1 | 3/2002 | Seiberle | |
| 2002/0097361 A1 | 7/2002 | Ham | |
| 2002/0167639 A1 | 11/2002 | Coates | |
| 2003/0021526 A1 | 1/2003 | Bouevitch | |
| 2003/0072896 A1 | 4/2003 | Kwok | |
| 2003/0152712 A1 | 8/2003 | Motomura | |
| 2003/0206288 A1 | 11/2003 | Tabirian et al. | |
| 2003/0218801 A1 | 11/2003 | Korniski | |
| 2004/0105059 A1 | 6/2004 | Ohyama | |
| 2004/0165126 A1 | 8/2004 | Ooi et al. | |
| 2005/0030457 A1 | 2/2005 | Kuan et al. | |
| 2005/0110942 A1 | 5/2005 | Ide | |
| 2005/0219696 A1 | 10/2005 | Albert et al. | |
| 2005/0271325 A1 | 12/2005 | Anderson et al. | |
| 2006/0008649 A1 | 1/2006 | Shinichiro | |
| 2006/0055883 A1 | 3/2006 | Morris et al. | |
| 2006/0109532 A1* | 5/2006 | Savas | G02B 5/1857 359/10 |
| 2006/0221449 A1 | 10/2006 | Glebov et al. | |
| 2006/0222783 A1 | 10/2006 | Hayashi | |
| 2007/0032866 A1 | 2/2007 | Portney | |
| 2007/0040469 A1 | 2/2007 | Yacoubian | |
| 2007/0115551 A1 | 5/2007 | Spilman | |
| 2007/0122573 A1 | 5/2007 | Yasuike | |
| 2007/0132930 A1 | 6/2007 | Ryu et al. | |
| 2007/0247586 A1 | 10/2007 | Tabirian | |
| 2007/0258677 A1 | 11/2007 | Chigrinov | |
| 2008/0226844 A1 | 9/2008 | Shemo | |
| 2008/0278675 A1 | 11/2008 | Escuti | |
| 2009/0002588 A1 | 1/2009 | Lee et al. | |
| 2009/0073331 A1 | 3/2009 | Shi | |
| 2009/0122402 A1 | 5/2009 | Shemo | |
| 2009/0141216 A1 | 6/2009 | Marrucci | |
| 2009/0256977 A1 | 10/2009 | Haddock | |
| 2009/0257106 A1 | 10/2009 | Tan | |
| 2009/0264707 A1 | 10/2009 | Hendricks | |
| 2010/0003605 A1* | 1/2010 | Gil | G03F 7/70466 430/1 |
| 2010/0066929 A1 | 3/2010 | Shemo | |
| 2011/0069377 A1 | 3/2011 | Wu et al. | |
| 2011/0075073 A1 | 3/2011 | Oiwa | |
| 2011/0085117 A1 | 4/2011 | Moon et al. | |
| 2011/0097557 A1 | 4/2011 | May | |
| 2011/0109874 A1 | 5/2011 | Piers et al. | |
| 2011/0135850 A1 | 6/2011 | Saha et al. | |
| 2011/0188120 A1 | 8/2011 | Tabirian et al. | |
| 2011/0234944 A1 | 9/2011 | Powers | |
| 2011/0262844 A1 | 10/2011 | Tabirian | |
| 2012/0140167 A1 | 6/2012 | Blum | |
| 2012/0162433 A1 | 6/2012 | Fuentes Gonzalez | |
| 2012/0188467 A1 | 7/2012 | Escuti | |
| 2013/0057814 A1 | 3/2013 | Prushinskiy et al. | |
| 2014/0055740 A1 | 2/2014 | Spaulding | |
| 2014/0211145 A1 | 7/2014 | Tabirian | |
| 2014/0252666 A1 | 9/2014 | Tabirian | |
| 2015/0049487 A1 | 2/2015 | Connor | |
| 2015/0081016 A1 | 3/2015 | De Sio et al. | |
| 2015/0276997 A1 | 10/2015 | Tabirian et al. | |
| 2016/0023993 A1 | 1/2016 | Tabirian | |

(56) References Cited

U.S. PATENT DOCUMENTS

| | | |
|---|---|---|
| 2016/0047955 A1 | 2/2016 | Tabirian et al. |
| 2016/0047956 A1 | 2/2016 | Tabirian et al. |
| 2017/0010397 A1 | 1/2017 | Tabirian et al. |

FOREIGN PATENT DOCUMENTS

| | | | |
|---|---|---|---|
| GB | 2209751 | | 5/1989 |
| JP | 2001142033 | | 5/2001 |
| JP | 2004226752 | | 8/2004 |
| WO | 2007122573 | | 11/2007 |
| WO | 2008/130559 | * | 10/2008 |
| WO | 2008130555 | | 10/2008 |

OTHER PUBLICATIONS

Ono et al., "Effects of phase shift between two photoalignment substrates on diffraction properties in liquid crystalline grating cells", Appl. Opt., vol. 48(2) pp. 309-315 (Jan. 2009).*
Naydenova et al., "Diffraction form polarization holographic gratings with surface relief in side chain azobenzene polyesters" J. Opt. Soc. Am. B, vol. 15, pp. 1257(1998).*
Oh et al., Achromatic polarization gratings as highly efficient thin-film polarizing beamsplitters for broadband light Proc. SPIE vol. 6682 pp. 668211-1 to 668211-12 (2007).*
Escuti et al., "A polarization-independent liquid crystal spatial light modiulator". Proc. SPIE 6332 63320M (8 pages) (2006).*
Nersisyan et al., "Polarization insensitive imaging through polarization gratings", Opt. Expr. vol. 17(3) pp. 1817-1830 (Feb. 2009).*
Sobolewska et al., "On the inscription of period and half period surface relief gratings in azobenzene-functionalized polymers", J. Phys. Chem., vol. 112 (15) pp. 4526-4535 (2008).*
Barrett et al. "Model of laser driven mass transport in thin films of dye-functionalized polymers", J Chem. Phys., vol. 109(4) pp. 1505-1516 (Jul. 1988).*
Koch et al. "Incoherent contact printing grating technology for WMD laser sources", Proc. Confer. Opt. Fiber Commun. Conf., PD23-1 (pp. 362-365 (1993).*
Serak, et al., Diffractive Waveplate Arrays [Invited], Journal of the Optical Society of America B, May 2017, pp. B56-B63, vol. 34, No. 5, 8 pages.
Emoto, et al., Optical and Physical Applications of Photocontrollable Materials: Azobenzene-Containing and Liquid Crystalline Polymers, Polymers, Jan. 2012, pp. 150-186, vol. 4, 38 pages.
Tabiryan, et al., The Promise of Diffractive Waveplates, OPN Optics and Photonics News, Mar. 2010, 6 pages.
Tabiryan, et al., Fabricating Vector Vortex Waveplates for Coronagraphy; Aerospace Conference, 2012, EEE; publicly available Apr. 19, 2012, 12 pages.
Tabirian, et al., PCT Application No. PCT/US15/26186 filed Apr. 16, 2015, Notification of Transmittal of the International Search Report and the Written Opinion of the International Searching Authority dated Jul. 14, 2015, 17 pages.
Nersisyan, et al., Study of azo dye surface command photoalignment material for photonics applications, Applied Optics, vol. 49, No. 10, Apr. 1, 2010, 8 pages.
Nersisyan, et al., Characterization of optically imprinted polarization gratings, Applied Optics, vol. 48, No. 21, Jul. 20, 2009, 6 pages.
Nersisyan, et al., Fabrication of Liquid Crystal Polymer Axial Waveplates for UV-IR Wavelengths, Optics Express, vol. 17, No. 14, Jul. 2009, 9 pages.
Nersisyan, et al., Optical Axis Gratings in Liquid Crystals and Their Use for Polarization Insensitive Optical Switching, Journal of Nonlinear Optical Physics & Materials, vol. 18, No. 1, 2009, 47 pages.
Tabirian, et al., U.S. Appl. No. 14/688,425, filed Apr. 16, 2015, Office Action Summary dated Oct. 5, 2017, 10 pages.
Sarkissian, et al., Longitudinally modulated nematic bandgap structure, Optical Society of America, vol. 23, No. 8, Aug. 2008, 6 pages.
Sarkissian, et al., Polarization-universal bandgap in periodically twisted nematics, Optics Letters, vol. 31, No. 11, Jun. 1, 2006, abstract, 4 pages.
Sarkissian, et al., Periodically Aligned Liquid Crystal: Potential Application for Projection Displays, Mol. Cryst. Liq. Cryst., vol. 451, 2006, 19 pages.
Sarkissian, et al., Potential application of Periodically Aligned Liquid Crystal cell for projection displays, JThE12, 2005, 3 pages.
Sarkissian, et al., Polarization-Controlled Switching Between Diffraction Orders in Transverse-Periodically Aligned Nematic Liquid Crystals, Optics Letters, Aug. 2006, abstract, 4 pages.
Schadt, et al., Photo-Induced Alignment and Patterning of Hybrid Liquid Crystalline Polymer Films on Single Substrates, Jpn. J. Appl. Phys., vol. 34, Part 2, No. 6B, Jun. 15, 1995, 4 pages.
Schadt , et al., Photo-Generation of Linearly Polymerized Liquid Crystal Aligning Layers Comprising Novel, Integrated Optically Patterned Retarders and Color Filters, Jpn. J. Appl. Phys., vol. 34, Part 1, No. 6A, Jun. 1995, 10 pages.
Schadt, et al., Optical patterning of multi-domain liquid-crystal displays with wide viewing angles, Nature, vol. 381, May 16, 1996, 4 pages.
Tabirian, U.S. Appl. No. 14/214,375, filed Mar. 14, 2014, Office Action Summary dated Jun. 27, 2017, 10 pages.
Marrucci, et al., Pancharatnam-Berry phase optical elements for wave front shaping in the visible domain, Appl. Phys. Lett. 88, 2006, 3 pages.
Escuti, et al., Simplified Spectropoolarimetry Using Reactive Mesogen Polarization Gratings, Imaging Spectrometry XI, Proc. of SPIE, vol. 6302, 2006, 11 pages.
Gibbons, et al., Surface-mediated alignment of nematic liquid crystals with polarized laser light, Nature, vol. 351, May 2, 1991, 1 page.
Gibbons, et al., Optically Controlled Alignment of Liquid Crystals: Devices and Applications, Molecular Crystals and Liquid Crystals, vol. 251, 1994, 19 pages.
Gibbons, et al., Optically generated liquid crystal gratings, Appl. Phys. Lett., 65, Nov. 14, 1994, 3 pages.
University of Central Florida, School of Optics CREOL PPCE, Optics in the Southeast, Technical Conference and Tabletop Exhibit, Nov. 12-13, 2003, 9 pages.
Ichimura, et al., Surface assisted photoalignment control of lyotropic liquid crystals, Part 1, Characterization and photoalignment of aqueous solutions of a water soluble dyes as lyotropic liquid crystals, J. Materials. Chem., vol. 12, 2002, abstract, 2 pages.
Ichimura, et al., Reversible Change in Alignment Mode of Nematic Liquid Crystals Regulated Photochemically by "Command Surfaces" Modified with an Azobenzene Monolayer, American Chemical Society, Langmuir, vol. 4, No. 5, 1988, 3 pages.
Zel'Dovich, et al., Devices for displaying visual information, Disclosure, School of Optics/CREOL, University of Central Florida, Jul. 2000, 10 pages.
Provenzano, et al., Highly efficient liquid crystal based diffraction grating induced by polarization holograms at the aligning surfaces, Applied Physics Letter 89, 2006, 4 pages.
Titus, et al., Efficient polarization-independent, re ective liquid crystal phase grating, Applied Physics Letter 71, Oct. 20, 1197, 3 pages.
Chen, et al. An Electrooptically Controlled Liquid-Crystal Diffraction Grating, Applied Physics Letter 67, Oct. 30, 1995, 4 pages.
Kim, et al., Unusual Characteristics of Diffraction Gratings in a Liquid Crystal Cell, Advanced Materials, vol. 14, No. 13-14, Jul. 4, 2002, 7 pages.
Pan, et al., Surface Topography and Alignment Effects in UV-Modified Polyimide Films with Micron Size Patterns, Chinese Journal of Physics, vol. 41, No. 2, Apr. 2003, 8 pages.
Fuh, et al., Dynamic studies of holographic gratings in dye-doped liquid-crystal films, Optics Letter, vol. 26, No. 22, Nov. 15, 2001, 3 pages.
Yu, et al., Polarization Grating of Photoaligned Liquid Crystals with Oppositely Twisted Domain Structures, Molecular Crystals Liquid Crystals, vol. 433, 2005, 7 pages.

(56) References Cited

OTHER PUBLICATIONS

Crawford, et al., Liquid-crystal diffraction gratings using polarization holography alignment techniques, Journal of Applied Physics 98, 2005, 10 pages.
Seiberle, et al., 38.1 Invited Paper: Photo-Aligned Anisotropic Optical Thin Films, SID 03 Digest, 2003, 4 pages.
Wen, et al., Nematic liquid-crystal polarization gratings by modification of surface alignment, Applied Optics, vol. 41, No. 7, Mar. 1, 2002, 5 pages.
Anagnostis, et al., Replication produces holographic optics in volume, Laser Focus World, vol. 36, Issue 3, Mar. 1, 2000, 6 pages.
Gale, Replicated Diffractive Optics and Micro-Optics, Optics and Photonics News, Aug. 2003, 6 pages.
McEldowney, et al., Creating vortex retarders using photoaligned LC polymers, Optics Letter, vol. 33, No. 2, Jan. 15, 2008, 3 pages.
Stalder, et al., Lineraly polarized light with axial symmetry generated by liquid-crystal polarization converters, Optics Letters vol. 21, No. 1996, 3 pages.
Kakichashvili, et al., Method for phase polarization recording of holograms, Sov. J. Quantum. Electron, vol. 4, No. 6, Dec. 1974, 5 pages.
Todorov, et al., High-Sensitivity Material With Reversible Photo-Induced Anisotropy, Optics Communications, vol. 47, No. 2, Aug. 15, 1983, 4 pages.
Attia, et al., Anisoptropic Gratings Recorded From Two Circularly Polarized Coherent Waves, Optics Communications, vol. 47, No. 2, Aug. 15, 1983, 6 pages.
Cipparrone, et al., Permanent polarization gratings in photosensitive langmuir blodget films, Applied Physics Letter, vol. 77, No. 14, Oct. 2, 2000, 4 pages.
Nikolova, et al., Diffraction Efficiency and Selectivity of Polarization Holographic Recording, Optica Acta: International Journal of Optics, vol. 31, No. 5, 1984, 11 pages.
Lee et al., "Generation of pretilt angles of liquid crystals on cinnamte-based photoalignment . . . ", Opt., Expr., vol. 17 (26)(Dec. 2009), abstract, 4 pages.
Yaroshchuk et al. "Azodyes as photoalignment agents for polymerizable liquid crystals", IDW'06 Digest vol. 1-3, 2006, 3 pages.
Chigrinov et al. "Anchoring properties of photoaligned azo-dye materials" Phys. Rev., E vol. 68, (Dec. 2003), 5 pages.
Pagliusi et al. Surface-induced photorefractivity in twistable nematics: toward the all-optical control of gain, Opt. Expr. vol. 16, Oct. 2008, 9 pages.
Dierking, Polymer Network-Stabilized Liquid Crystals, Advanced Materials, vol. 12, No. 3, 2000, 15 pages.
Tabiryan, et al., Broadband waveplate lenses, Optics Express 7091, vol. 24, No. 7, Mar. 24, 2016, 12 pages.
Tabiryan, et al. Thin waveplate lenses of switchable focal length—new generation in optics, Optics Express 25783, vol. 23, No. 20, Sep. 19, 2015, 12 pages.
Tabiryan, et al. Superlens in the skies: liquid-crystal-polymer technology for telescopes, Newsroom, 2016, 2 pages.
Nersisyan, et al., The principles of laser beam control with polarization gratings introduced as diffractive waveplates, Proc. of SPIE, vol. 7775, 2010, 10 pages.
Heller, A Giant Leap for Space Telescopes, Foldable Optics, S&TR, Mar. 2003, 7 pages.
Beam Engineering for Advanced Measurements Co., PCT Application No. PCT/US2015026186, The Extended European Search Report, filed on Mar. 8, 2017, 13 pages.
Blinov, et al., Electrooptic Effects in Liquid Crystal MAterials, Springer-Verlag New York, 1994, 17 pages.
Crawford, et al., Liquid Crystals in Complex Geometries; Formed by Polymer and Porous Networks, Taylor and Francis, 1996, 4 pages.
Honma, et al., Liquid-Crystal Fresnel Zone Plate Fabricated by Microorubbing, Japanese Journal of Applied Phsyics, vol. 44, No. 1A, 2005, 4 pages.
M. Honma, T. Nose, Polarization-independent liquid crystal grating fabricated by microrubbing process, Jpn. J. Appl. Phys., Part 1, vol. 42, 2003, 3 pages.
Anderson, G., et al., Broadband Antihole Photon Sieve Telescope, Applied Optics, vol. 16, No. 18., Jun. 2007, 3 pages.
Early, J. et al., Twenty Meter Space Telescope Based on Diffractive Fresnel Lens, SPIE, U.S. Department of Energy, Lawrence Livermore National Laboratory, Jun. 2003, 11 pages.
Martinez-Cuenca, et al., Reconfigurable Shack-Hartmann Sensor Without Moving Elements,Optical Society of America, vol. 35, No. 9, May 2010, 3 pages.
Serak, S., et al., High-efficiency 1.5 mm Thick Optical Axis Grating and its Use for Laser Beam Combining, Optical Society of America, vol. 32, No., Jan. 2007, 4 pages.
Tabirian, N., et al., U.S. Appl. No. 61/757,259, filed Jan. 28, 2013, 29 pages.
Beam Engineering for Advaced Measurements Co., et al., PCT Application No. PCT/US2016/038666 filed Jun. 22, 2016, Notification of Transmittal of the International Search Report and the Written Opinion of the International Searching Authority, or the Declaration dated Oct. 10, 2016, 16 pages.
Nersisyan, S., et al., Polarization insensitive imaging through polarization gratins, Optics Express, vol. 17, No. 3, Feb. 2, 2009, 14 pages.
OISE, Optics in the Southeast, Technical Conference and Tabletop Exhibit, Optical Society of America, Orlando, FL., Nov. 12-13, 2003, 9 pages.
Pepper, M. et al, Nonlinear Optical Phase Conjugation, IEEE, Sep. 1991, pp. 21-34, 14 pages.
Tabirian, N., Utility U.S. Appl. No. 14/194,808, filed Mar. 2, 2014, Office Action Summary dated Feb. 9, 2018, 10 pages.
Tabirian, N., Utility U.S. Appl. No. 14/324,126, filed Jul. 4, 2014, Office Action Summary dated Feb. 8, 2018, 13 pages.
Tabirian, N., U.S. Appl. No. 15/189,551 filed Jun. 22, 2016, Office Action Summary dated Feb. 27, 2018, 16 pages.

\* cited by examiner 103  106

106  103

FABRICATION OF HIGH EFFICIENCY, HIGH QUALITY, LARGE AREA DIFFRACTIVE WAVEPLATES AND ARRAYS

RELATED APPLICATIONS

This application is a Continuation of U.S. patent application Ser. No. 13/860,934, now abandoned, which is a continuation of U.S. Patent Application entitled "Fabrication Of High Efficiency, High Quality, Large Area Diffractive Waveplates And Arrays", filed Apr. 11, 2013, now abandoned, and given U.S. Ser. No. 13/860,934 which is a Continuation of Ser. No. 12/662,525 now abandoned filed Apr. 21, 2010 now abandoned.

STATEMENT REGARDING FEDERALLY SPONSORED RESEARCH OR DEVELOPMENT

This invention was made with Government support under Contract No. W911QY-07-C-0032. The invention described herein may be manufactured and used by or for the Government of the United States for all governmental purposes without the payment of any royalty.

CROSS REFERENCES

Sh. D. Kakichashvili, "Method for phase polarization recording of holograms," Sov. J. Quantum. Electron. 4, 795-798, 1974.

T. Todorov, et al., High-sensitivity material with reversible photo-induced anisotropy, Opt. Commun., 47, 123-126, 1983.

M. Attia, et al., "Anisotropic gratings recorded from two circularly polarized coherent waves," Opt. Commun., 47, 85-90, 1983.

G. Cipparrone, et. al, "Permanent polarization gratings in photosensitive langmuir blodget films," Appl. Phys. Lett. 77, 2106-2108, 2000.

L. Nikolova et al., "Diffraction efficiency and selectivity of polarization holographic recording," Optica Acta 31, 579-588, 1984.

K. Ichimura, et al., "Reversible Change in Alignment Mode of Nematic Liquid Crystals Regulated Photochemically by Command Surfaces Modified with an Azobenzene Monolayer," Langmuir 4, 1214-1216, 1988.

W. M. Gibbons, et al., "Surface-mediated alignment of nematic liquid crystals with polarized laser light," Nature 351, 49-50, 1991.

W. M. Gibbons, et al., "Optically controlled alignment of liquid crystals: devices and applications," Mol. Cryst. Liquid Cryst., 251, 191-208, 1994.

W. M. Gibbons, et al., "Optically generated liquid crystal gratings," Appl. Phys. Lett., 65, 2542-2544, 1994.

M. Schadt, et al., "Optical patterning of multi-domain liquid-crystal displays with wide viewing angles," Nature 381, 212-215, 1996.

S. R. Nersisyan, et al., "Optical Axis Gratings in Liquid Crystals and their use for Polarization insensitive optical switching," J. Nonlinear Opt. Phys. & Mat., 18, 1-47, 2009.

N. V. Tabiryan, et al., "The Promise of Diffractive Waveplates," Optics and Photonics News, 21, 41-45, 2010.

H. Sarkissian et al., "Periodically Aligned Liquid Crystal: Potential application for projection displays," Storming Media Report, A000824, 2004.

H. Sarkissian, et al., "Periodically aligned liquid crystal: potential application for projection displays and stability of LC configuration," Optics in the Southeast 2003, Orlando, Fla., Conference Program, PSE 02.

H. Sarkissian, et al., "Potential application of periodically aligned liquid crystal cell for projection displays," Proc. of CLEO/QELS Baltimore Md., poster JThE12, 2005.

B. Ya. Zeldovich, N. V. Tabirian, "Devices for displaying visual information," Disclosure, School of Optics/CREOL, July 2000.

C. Provenzano, et al., "Highly efficient liquid crystal based diffraction grating induced by polarization holograms at the aligning surfaces," Appl. Phys. Lett., 89, 121105(1-3), 2006

M. J. Escuti et al., "A polarization-independent liquid crystal spatial-light-modulator," Proc. SPIE 6332, 63320M(1-8), 2006.

C. M. Titus et al., "Efficient, polarization-independent, reflective liquid crystal phase grating," Appl. Phys. Lett., 71, 2239-2241, 1997.

J. Chen, et al., "An electro-optically controlled liquid crystal diffraction grating, Appl. Phys. Lett. 67, 2588-2590, 1995.

B. J. Kim, et al., "Unusual characteristics of diffraction gratings in a liquid crystal cell," Adv. Materials, 14, 983-988, 2002.

R.-P. Pan, et al., "Surface topography and alignment effects in UV-modified polyimide films with micron size patterns," Chinese J. of Physics, 41, 177-184, 2003.

A. Y.-G. Fuh, et al., "Dynamic studies of holographic gratings in dye-doped liquid-crystal films," Opt. Lett. 26, 1767-1769, 2001.

C.-J. Yu, et al., "Polarization grating of photoaligned liquid crystals with oppositely twisted domain structures," Mol. Cryst. Liq. Cryst., Vol. 433, pp. 175-181, 2005.

G. Crawford, et al., "Liquid-crystal diffraction gratings using polarization holography alignment techniques," J. of Appl. Phys. 98, 123102 (1-10), 2005.

M. Schadt, et al. "Photo-Induced Alignment and Patterning of Hybrid Liquid Crystalline Polymer Films on Single Substrates," Jpn. J. Appl. Phys. 34, L764-L767 1995.

M. Schadt, et al. "Photo-Generation of Linearly Polymerized Liquid Crystal Aligning Layers Comprising Novel, Integrated Optically Patterned Retarders and Color Filters," Jpn. J. Appl. Phys. 34, 3240-3249, 1995.

H. Seiberle, et al., "Photo-aligned anisotropic optical thin films," SID 03 Digest, 1162-1165, 2003.

B. Wen, et al., "Nematic liquid-crystal polarization gratings by modification of surface alignment," Appl. Opt. 41, 1246-1250, 2002.

J. Anagnostis, D. Rowe, "Replication produces holographic optics in volumes", Laser Focus World 36, 107-111, 2000.

M. T. Gale, "Replicated diffractive optics and micro-optics", Optics and Photonics News, August 2003, 24-29.

S. R. Nersisyan, et al., "Characterization of optically imprinted polarization gratings," Appl. Optics 48, 4062-4067, 2009.

H. Sarkissian, et al., "Periodically aligned liquid crystal: potential application for projection displays," Mol. Cryst. Liquid Cryst., 451, 1-19, 2006.

V. G. Chigrinov, et al., "Photoaligning: physics and applications in liquid crystal devices", Wiley VCH, 2008.

S. C. McEldowney et al., "Creating vortex retarders using photoaligned LC polymers," Opt. Lett., Vol. 33, 134-136, 2008.

U.S. PATENT DOCUMENTS

| 2009/0141216 | June 2009 | Marrucci |
| 7,196,758 | March 2007 | Crawford et al. |
| US2008/0278675 | November 2008 | Escuti et al. |
| 3,897,136 | July 1975 | Bryngdahl |
| 2010/0066929 | March 2010 | Shemo et al. |
| 5,903,330 | May 1999 | Fünfshilling et al. |
| 5,032,009 | July 1991 | Gibbons et al. |

FIELD OF THE INVENTION

This invention relates to fabrication of one or two dimensional diffractive waveplates and their arrays, those waveplates including "cycloidal" waveplates, optical axis gratings, polarization gratings (PGs), axial waveplates, vortex waveplates, and q-plates.

BACKGROUND OF THE INVENTION

Polarization recording of holograms and related "polarization gratings" were conceived in 1970's as a method for recording and reconstructing the vector field of light. A light sensitive material that acquired birefringence under the action of polarized light was suggested in the first studies (Sh. D. Kakichashvili, "Method for phase polarization recording of holograms," Sov. J. Quantum. Electron. 4, 795, 1974).

Examples of such photoanisotropic media included colored alkali halide crystals regarded particularly promising due to reversibility of the recording process consisting in optically altering the orientation of anisotropic color centers in the crystal.

A grating characterized only by spatial variations in the orientation of the induced optics axis can be obtained when the photoanisotropic medium is exposed to a constant intensity, rectilinear light vibrations, with spatially varying orientation, obtained from superposition of two orthogonal circularly polarized waves propagating, in slightly different directions (M. Attia, et al., "Anisotropic gratings recorded from two circularly polarized coherent waves," Opt. Commun. 47, 85, 1983). The use of Methyl Red azobenzene dye in a polymer layer allowed to claim that photochemical processes in such material systems would enable obtaining 100 percent diffraction efficiency even in "thin" gratings (T. Todorov, et al., "High-sensitivity material with reversible photoinduced anisotropy," Opt. Commun. 47, 123, 1983). Highly stable polarization gratings with orthogonal circular polarized beams are obtained in thin solid crystalline Langmuir-Blodgett films composed of amphiphilic azo-dye molecules showing that "100% efficiency may be achieved for samples less than 1 µm thick" (G. Cipparrone, et al., "Permanent polarization gratings in photosensitive langmuir-blodget films," Appl. Phys. Lett. 77, 2106, 2000).

A material possessing birefringence that is not influenced by light is an alternative to the photoanisotropic materials that are typically capable of only small induced birefringence (L. Nikolova et al., "Diffraction efficiency and selectivity of polarization holographic recording," Optica Acta 31, 579, 1984). The orientation of such a material, a liquid crystal (LC), can be controlled with the aid of "command surfaces" due to exposure of the substrate carrying the command layer to light beams (K. Ichimura, et al., "Reversible Change in Alignment Mode of Nematic Liquid Crystals Regulated Photochemically by Command Surfaces Modified with an Azobenzene Monolayer," Langmuir 4, 1214, 1988). Further a "mechanism for liquid-crystal alignment that uses polarized laser light" was revealed (W. M. Gibbons, et al., "Surface-mediated alignment of nematic liquid crystals with polarized laser light," Nature 351, 49, 1991; W. M. Gibbons, et al., "Optically controlled alignment of liquid crystals: devices and applications," Mol. Cryst. Liquid Cryst., 251, 191, 1994). Due to localization of dye near the interface, the exposure can be performed in the absence of LC, and the LC is aligned with high spatial and angular resolution (potentially, submicron) after filling the cell (W. M. Gibbons, et al., "Optically generated liquid crystal gratings," Appl. Phys. Lett 65, 2542, 1994). Variety of photoalignment materials are developed for achieving high resolution patterns and obtaining variation of molecular alignment within individual pixels (M. Schadt, et al., "Optical patterning of multi-domain liquid-crystal displays with wide viewing angles," Nature 381, 212, 1996). A critically important issue for producing LC orientation patterns at high spatial frequencies is their mechanical stability. Particularly, the cycloidal orientation of LCs obtained due to the orienting effect of boundaries is stable only when a specific condition between the material parameters, the cell thickness, and the period of LC orientation modulation is fulfilled (H. Sarkissian et al., "Periodically Aligned Liquid Crystal: Potential application for projection displays," Storming Media Report, A000824, 2004; H. Sarkissian, et al., "Periodically aligned liquid crystal: potential application for projection displays and stability of LC configuration," Optics in the Southeast 2003, Orlando, Fla.; Conference Program, PSE 02. and H. Sarkissian, et al., "Potential application of periodically aligned liquid crystal cell for projection displays," Proc. of CLEO/QELS Baltimore Md., poster JThE12, 2005; B. Ya. Zeldovich, N. V. Tabirian, "Devices for displaying visual information," Disclosure, School of Optics/CREOL, July 2000). Suggesting fabrication of cycloidal polarization gratings using the photoalignment technique with overlapping right and left circularly polarized beams, the publications by Sarkissian, Zeldovich and Tabirian cited above are credited for having theoretically proven polarization gratings can be 100% efficient and can be used as a diffractive grating for projection displays (C. Provenzano, et al., "Highly efficient liquid crystal based diffraction grating induced by polarization holograms at the aligning surfaces," Appl. Phys. Lett., 89, 121105, 2006; M. J. Escuti et al., "A polarization-independent liquid crystal spatial-light-modulator," Proc. SPIE 6332, 63320M, 2006).

LCs with spatially modulated orientation patterns produced using the photoalignment technique are known in the prior art (W. M. Gibbons, et al., "Surface-mediated alignment of nematic liquid crystals with polarized laser light," Nature 351, 49, 1991; C. M. Titus et al., "Efficient, polarization-independent, reflective liquid crystal phase grating," Appl. Phys. Lett. 71, 2239, 1997; J. Chen, et al., "An electro-optically controlled liquid crystal diffraction grating, Appl. Phys. Lett. 67, 2588, 1995; B. J. Kim, et al., "Unusual characteristics of diffraction gratings in a liquid crystal cell," Adv. Materials 14, 983, 2002; R.-P. Pan, et al., "Surface topography and alignment effects in UV-modified polyimide films with micron size patterns," Chinese J. of Physics 41, 177, 2003; A. Y.-G. Fuh, et al., "Dynamic studies of holographic gratings in dye-doped liquid-crystal films," Opt. Lett. 26, 1767, 2001; C.-J. Yu, et al., "Polarization grating of photoaligned liquid crystals with oppositely twisted domain structures," Mol. Cryst. Liq. Cryst. 433, 175, 2005; G. Crawford, et al., "Liquid-crystal diffraction gratings using polarization holography alignment techniques," J. of Appl. Phys: 98, 123102, 2005; Crawford et al., U.S. Pat. No. 7,196,758).

LC polymers were widely used as well (M. Schadt, et al. "Photo-Induced Alignment and Patterning of Hybrid Liquid Crystalline Polymer Films on Single Substrates," Jpn. J. Appl. Phys. 34, L764 1995; M. Schadt, et al. "Photo-Generation of Linearly Polymerized Liquid Crystal Aligning Layers Comprising Novel, Integrated Optically Patterned Retarders and Color Filters," Jpn. J. Appl. Phys. 34, 3240, 1995; Escutti et al, US Patent Application US2008/0278675;). Photo-aligned anisotropic thin films can be applied to rigid or flexible substrates, which may be flat or curved and/or generate patterned retarders with continuous or periodical inplane variation of the optical axis (H. Seiberle, et al., "Photo-aligned anisotropic optical thin films," SID 03 Digest, 1162, 2003).

The cycloidal diffractive waveplates (CDWs) wherein the optical axis of the material is periodically rotating in the plane of the waveplate along one axis of a Cartesian coordinate system are the most interesting one-dimensional structures used for applications such as displays, beam steering systems, spectroscopy etc. These are known also as cycloidal DWs (CDWs), optical axis gratings, and polarization gratings (PGs) (S. R. Nersisyan, et al., "Optical Axis Gratings in Liquid Crystals and their use for Polatization insensitive optical switching," J. Nonlinear Opt. Phys. & Mat. 18, 1, 2009). Most interesting for applications two-dimensional orientation patterns possess with axial symmetry (N. Y. Tabiryan, et al., "The Promise of Diffractive Waveplates," Optics and Photonics News 21, 41, 2010; L. Marucci, US Patent Application 2009/0141216; Shemo et al., US Patent Application 2010/0066929).

Thus, in the prior art, optical axis modulation patterns of anisotropic material systems were demonstrated, including in LCs and LC polymers, due to modulation of boundary alignment conditions, and it was shown that such boundary conditions can be achieved by a number of ways, including using photoaligning materials, orthogonal circular polarized beams, microrubbing, and substrate rotation (Fünfshilling et al., U.S. Pat. No. 5,903,330; B. Wen, et al., "Nematic liquid-crystal polarization gratings by modification of surface alignment," Appl. Opt. 41, 1246, 2002; S. C. McEldowney et al., "Creating vortex retarders using photoaligned LC polymers," Opt. Lett., Vol. 33, 134, 2008). LC optical components with orientation pattern created by exposure of an alignment layer to a linear polarized light through a mask, by scanning a linear polarized light beam in a pattern, or creating a pattern using an interference of coherent beams is disclosed in the U.S. Pat. No. 5,032,009 to Gibbons, et al. Also, in the prior art, "Optically controlled planar orientation of liquid crystal molecules with polarized light is used to make phase gratings in liquid crystal media" (W. M. Gibbons and S.-T. Sun, "Optically generated liquid crystal gratings," Appl. Phys. Lett. 65, 2542, 1994).

DWs are characterized by their efficiency, optical homogeneity, scattering losses, and size. While acceptable for research and development purposes, none of the techniques known in the prior art can be used for fabricating high quality DWs and their arrays in large area, inexpensively, and in high volume production. Since DWs consist of a pattern of optical axis orientation, they cannot be reproduced with conventional techniques used for gratings of surface profiles (J. Anagnostis, D. Rowe, "Replication produces holographic optics in volumes", Laser Focus World 36, 107, 2000); M. T. Gale, "Replicated diffractive optics and micro-optics", Optics and Photonics News, August 2003, p. 24).

It is the purpose of the present invention to provide method for the production of DWs. The printing method of the current invention does not require complex holographic setups, nor special alignment or vibration isolation as described in the publications S. R. Nersisyan, et al., "Optical Axis Gratings in Liquid Crystals and their use for Polarization insensitive optical switching," J. Nonlinear Opt. Phys. & Mat., 18, 1, 2009; S. R. Nersisyan, et al., "Characterization of optically imprinted polarization gratings," Appl. Optics 48, 4062, 2009 and N. V. Tabiryan, et al., "The Promise of Diffractive Waveplates," Optics and Photonics News, 21, 41, 2010, which are incorporated herein by reference.

Energy densities required for printing DWs are essentially the same as in the case of producing a waveplate in a holographic process. This makes fabrication of diffractive waveplates much faster compared to mechanical scanning or rotating techniques. A technique for obtaining polarization modulation patterns avoiding holographic setups was discussed earlier in the U.S. Pat. No. 3,897,136 to O. Bryngdahl. It discloses a grating "formed from strips cut in different directions out of linearly dichroic polarizer sheets. The gratings were assembled so that between successive strips a constant amount of rotation of the transmittance axes occurred." These were also essentially discontinuous structures, with the angle between the strips $\pi/2$ and $\pi/6$ at the best. The size of individual strips was as large as 2 mm. Thus, such a grating modulated polarization of the output light at macroscopic scales and could not be used for production of microscale-period gratings with diffractive properties at optical wavelengths.

BRIEF SUMMARY OF THE INVENTION

Thus, the objective of the present invention is providing means for fabricating high quality DWs in large area, typically exceeding 1" in sizes, in large quantities, with high yield, and low cost.

The second objective of the present invention is providing means for fabricating DWs with different periods of optical axis modulation.

The invention, particularly, includes converting a linear or unpolarized light, generally non-monochromatic, incoherent or partially coherent, into a light beam of a periodic pattern of polarization modulation and subjecting materials with capability of photoalignment to said pattern for time periods exceeding the times otherwise required for obtaining homogeneous orientation state.

Further objectives and advantages of this invention will be apparent from the following detailed description of presently preferred embodiment, which is illustrated schematically in the accompanying drawings.

DETAILED DESCRIPTION OF THE INVENTION

Before explaining the disclosed embodiment of the present invention in detail it is to be understood that the invention is not limited in its application to the details of the particular arrangement shown since the invention is capable of other embodiments. Also, the terminology used herein is for the purpose of description and not limitation.

Figure 1A:
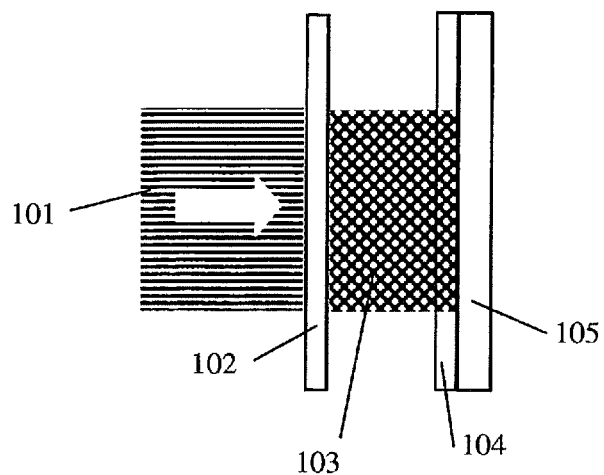
FIG. 1A shows the schematic of printing DWs.
Figure 1B:
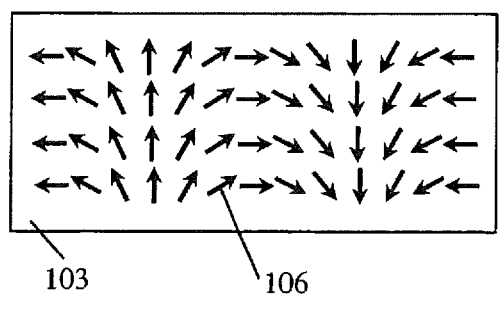
FIG. 1B schematically shows distribution of light polarization at the output of the linear-to-cycloidal polarization converter.
Figure 1C:
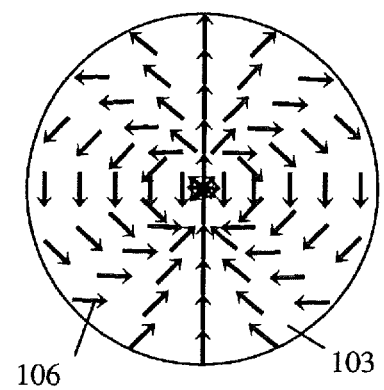
FIG. 1C schematically shows distribution of light polarization at the output of a linear-to-axial polarization converter.
Figure 1D:
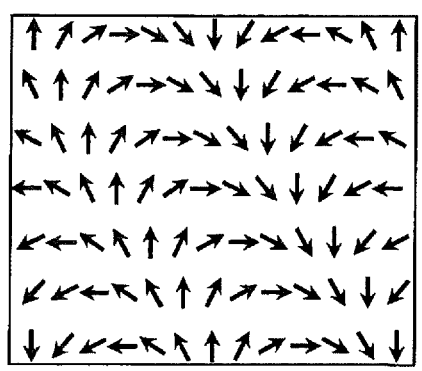
FIG. 1D schematically shows distribution of light polarization at the output of a two dimensional cycloidal polarization converter.

The preferred embodiment of the present invention shown in FIG. 1A includes a light beam 101 incident upon an optical component 102 capable of converting the incident light beam 101 into a beam with spatially modulated polarization pattern 103. Of particular interest are "cycloidal" and axial modulation patterns shown schematically in FIG. 1B and FIG. 1C, correspondingly, wherein the numerals 106 indicate the linear polarization direction at each point of the plane at the output of the polarization converter (S. R. Nersisyan; et al., "Characterization of optically imprinted polarization gratings," Appl. Optics 48, 4062, 2009). One polarization modulation period is shown in FIG. 1B, and the polarization direction is reversed 4 times for the example of the axially modulated pattern shown in FIG. 1C. Polarization modulation may have other distributions as exemplified by the two-dimensional cycloidal pattern shown in FIG. 1D.

A photoresponsive material film 104 capable of producing an internal structure aligned according to the polarization pattern 103, deposited on a substrate 105, is arranged in the area with spatially modulated polarization pattern. Examples of such materials include photoanisotropic materials such as azobenzene or azobenzene dye doped polymers, and photoalignment materials such as azobenzene derivatives, cinnamic acid derivatives, coumarine derivatives, etc.

Figure 2A:
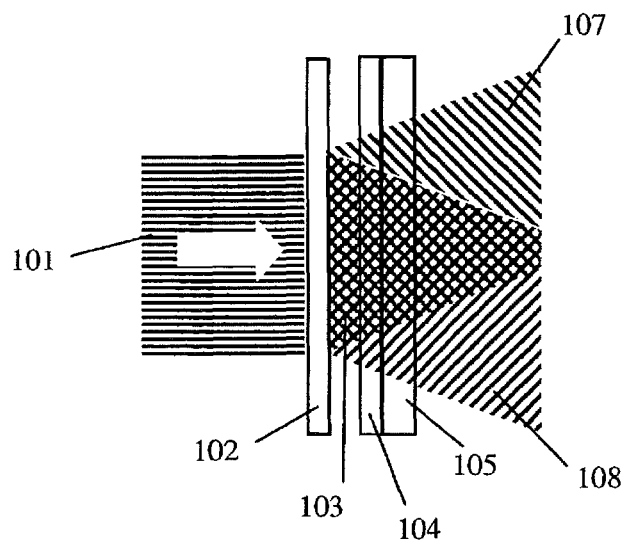
FIG. 2A shows the schematic of printing DWs using a cycloidal DW as a polarization converter.
Figure 2B:
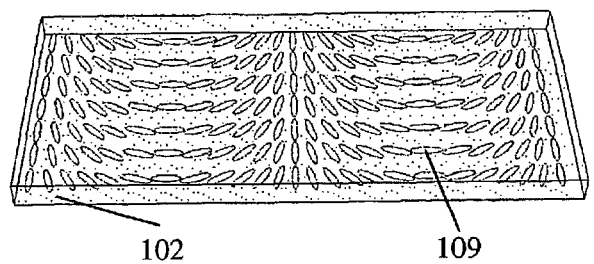
FIG. 2B shows the schematic of a cycloidal DW.

In case shown in FIG. 2A, a cycloidal diffractive waveplate (CDW) is used as polarization converter 102. The structure of said CDW is schematically shown in FIG. 2B wherein the numeral 109 indicates the alignment direction of the optical axis of the material. The cycloidal polarization pattern is obtained at the vicinity of the converter, near its output surface, in the overlap region of the diffracted beams 107 and 108.

The simplicity of this method, its insensitivity to vibrations, noises, air flows, as opposed to the holographic techniques makes feasible manufacturing high quality DWs with high diffraction efficiency in large areas exceeding 1" in sizes and in large quantities with low cost. Note that adding a polarizer at the output of the DW transforms the polarization modulation pattern into a pattern of intensity modulation that could be used for printing diffractive optical elements as well.

Figure 3:
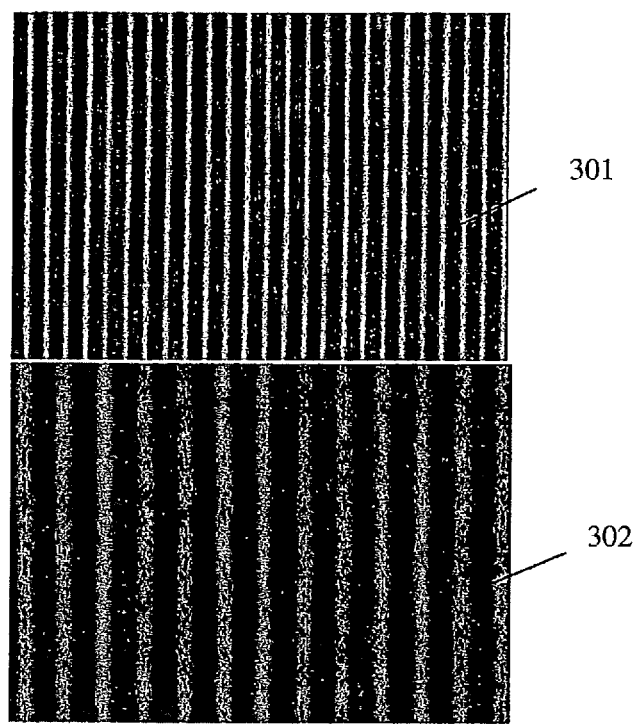
FIG. 3 shows spatial frequency doubling of a cycloidal DW in the printing process. Photos are obtained under polarizing microscope with 100× magnification.
Figure 4:
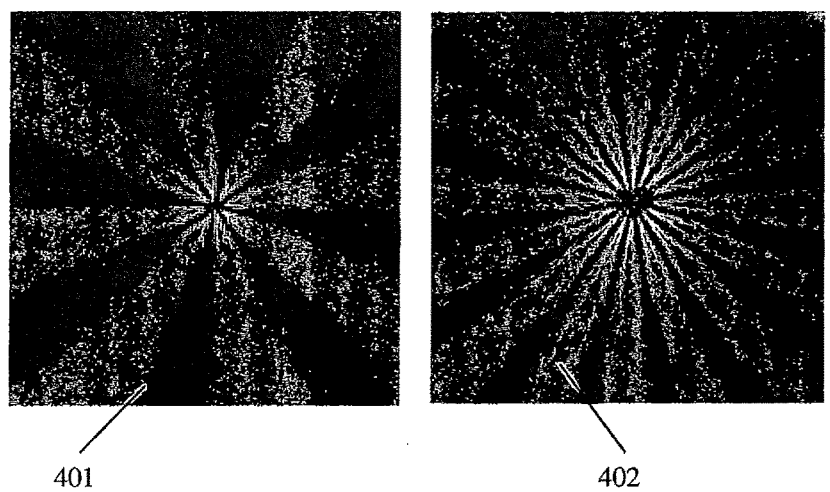
FIG. 4 shows two consecutive doubling of the order of an axially symmetric DW.

The spatial period of the printed DW is equal to that of the DW used as a polarization converter when a circular polarized light is used. A linear polarized light, however, yields in a DW with twice shorter period of the optical axis modulation. This is evident, FIG. 3, in the photos of the structure of the DW 301 produced via printing using a linear polarized light beam as compared to the structure of the DW 302 used as a polarization converter. Photos were obtained under polarizing microscope with 100× magnification (S. R. Nersisyan, et al., "Characterization of optically imprinted polarization gratings," Appl. Optics 48, 4062, 2009). This applies both to CDWs as well as to the diffractive waveplates with axial symmetry of optical axis orientation (ADWs) shown in FIG. 4 wherein the numeral 401 corresponds to the ADW used as a polarization converter, and 402 corresponds to the ADW obtained as a result of printing (N. V. Tabiryan, S. R. Nersisyan, D. M. Steeves and B. R. Kimball, The Promise of Diffractive Waveplates, Optics and Photonics News 21, 41, 2010). The technique of doubling the spatial frequency allows producing high degree ADWs and their arrays without using mechanical rotating setups.

Each DW in these examples was obtained by deposition of a LC polymer on the substrate carrying the photoalignment layer. This process of LC polymer deposition involves spin coating, heating to remove residual solvents, and polymerization in an unpolarized UV light. Other coating techniques (spray coating, as an example) and polymerization techniques (heating, as an example) are known and can be used for this purpose. The period of the printed CDW can be varied also by incorporating an optical system that projects the cycloidal polarization pattern onto larger or smaller area.

Figure 5:
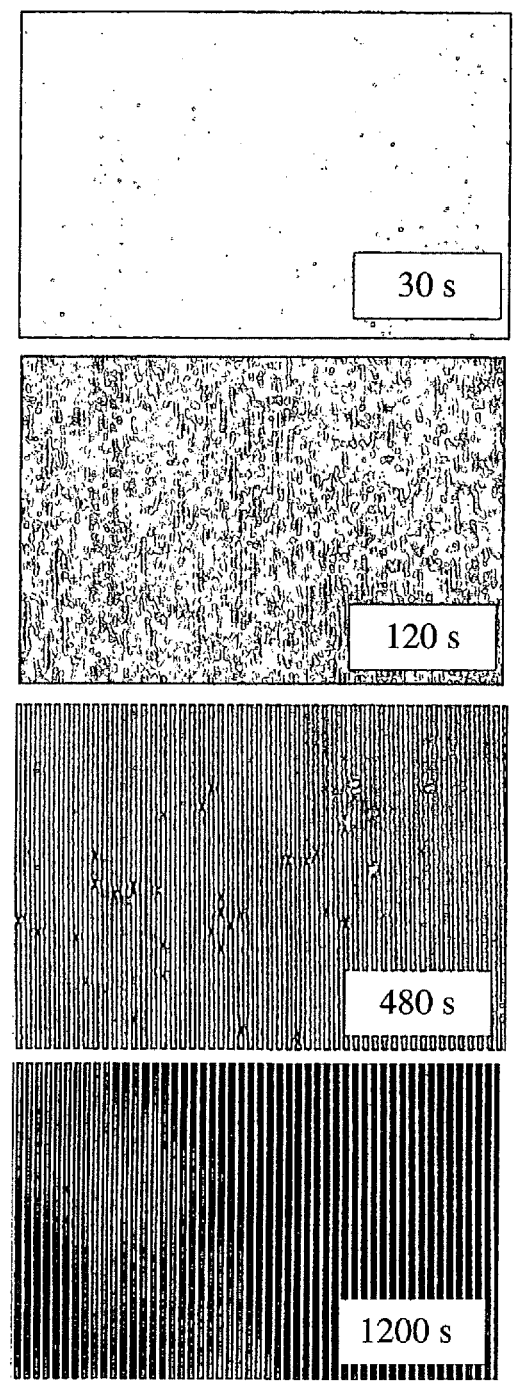
FIG. 5 shows photos of the structure of cycloidal DWs obtained under polarizing microscope for different exposure times. Photos are obtained under polarizing microscope with 40× magnification.

Another key aspect of the present invention consists in the disclosure that the photoalignment materials need to be exposed to cycloidal polarization pattern of radiation for time periods considerably exceeding the exposure time required for obtaining homogeneous aligning films at a given power density level of radiation. As an example, ROLIC Ltd. specifies 50 mJ/cm2 exposure energy density for its material ROP 103 at the wavelength 325 nm. Exposure with such an energy density yields in good homogeneous alignment, however, the structure of cycloidal DWs fabricated according to that recipe appears very poor under polarizing microscope as shown in FIG. 5. Extending the exposure time improves the structure, and practically defect-free structure is obtained for exposure energies >1 J/cm$^2$ that is 20× exceeding the specified values for this particular material.

The quality of DWs fabricated in conventional holographic process depends on many factors: the quality of the overlapping beams; the susceptibility of the holographic setup to mechanical vibrations and air fluctuations in the path of the beam; the coherence of the beams and equality of their paths; depolarization effects due to propagation of the beams through multiple optical elements such as lenses and beam splitters; the quality of the substrate; the qualities of the photoalignment materials, their affinity with the substrate in use and the effects of spin coating and solvent evaporation process. These factors include the homogeneity of the LCs layer thickness, and their compatibility issues with the photoalignment layer. The compatibility of the LC materials with the photoalignment material is important as well. Typical thickness of these films is in the micrometer range, whereas thickness variation for as little as the wavelength of radiation, ~0.5 μm for visible wavelengths, can dramatically affect the diffraction efficiency of those components. The absolute value of the thickness is as important due to orientation instabilities that is determined, among other things, by the ratio of the layer thickness to the modulation period (H. Sarkissian, et al., "Periodically aligned liquid crystal: potential application for projection displays," Mol. Cryst. Liquid Cryst., 451, 1, 2006).

Among all these factors, the exposure energy, being a parameter easy to control and specified by its supplier appears to be the least suspected to affect the quality of the DW being fabricated. With all the noises, impurities, and uncertainties in many steps involved in the process, the obtained component would still show relatively small areas of good quality, good enough for a university research, but beyond the acceptable limits for practical applications. Thus, the finding that the exposure times shall considerably exceed photoaligning material specifications is critically important for fabrication of high quality DWs with homogeneous properties in a large area.

The reasons for such an effect of the exposure time lie, apparently, in the need to produce stronger forces to support a pattern of spatial modulation of the optical axis than those required for homogeneous alignment. Elastic forces against modulation of molecular orientation are strong in LC materials. Longer exposure induces stronger modulation of the microscopic orientation properties of the photoaligning materials. Anchoring energy of such materials for LCs are not comprehensively studied. The available data relate to homogeneous orientation (V. G. Chigrinov, et al., "Photoaligning: physics and applications in liquid crystal devices", Wiley VCH, 2008).

Due to robustness of the printing method to the mechanical and other ambient noise, large area components can be fabricated by continuously translating the substrate in the region of cycloidal polarization pattern. By that, the energy of the light beam can be distributed along a long strip to produce a larger photoalignment area.

Although the present invention has been described above by way of a preferred embodiment, this embodiment can be modified at will, within the scope of the appended claims, without departing from the spirit and nature of the subject invention.

What is claimed is:

1. A method for producing orientation modulation of an anisotropy axis of a photoresponsive material layer at a predetermined spatial period, the method comprising:
   (a) emitting a light beam being at least partially coherent and having a linear polarization from a light source;
   (b) using a polarization converter to periodically modulate in space the polarization of said light beam, the polarization converter having an optical axis modulation period that is twice larger than said predetermined spatial period, said polarization converter comprising at least one diffractive waveplate that is achromatic and is part of an array of diffractive waveplates, and provides diffraction efficiency greater than 95% over an area of greater than 1" in diameter, and scattering losses less than 1%;
   (c) providing a photoresponsive material layer having an absorption spectrum that comprises wavelengths of said light beam, and having an anisotropy axis that is formed according to polarization of said light beam; and
   (d) exposing at least a portion of said photoresponsive material layer by projecting a polarization modulation pattern produced by said polarization converter at an exposure energy density optimized for producing alignment of the anisotropy axis of the photoresponsive material layer at a predetermined spatial period without causing degradation of the photoresponsive material layer, said exposure energy density exceeding at least 5 times the exposure energy density sufficient for producing waveplates with homogeneous orientation of the optical axis whereby a sole result of exposing the photoresponsive material layer to the polarization modulation pattern is the alignment of the anisotropy axis in said photoresponsive material according to the polarization modulation pattern.

2. The method of claim 1 wherein said projecting generally changes the size, shape and topography of said polarization modulation pattern obtained at the output of said polarization converter.

3. The method of claim 1 wherein said at least one diffractive waveplate comprises at least one cycloidal diffractive waveplate.

4. The method of claim 1 further comprising providing at least one substrate for controlling at least one of the following properties of said photoresponsive material layer: mechanical shape and stability, thermal conductivity, thickness homogeneity, radiation resistance, and resistance to adverse ambient conditions.

5. The method of claim 1 further comprising at least one anisotropic material layer, wherein said optical axis modulation of at least one of said anisotropic material layers is twisted in a direction perpendicular to the modulation plane of the anisotropy axis of said photoresponsive material layer.

6. An apparatus for producing spatially periodic orientation modulation of an anisotropy axis of a photoresponsive material layer at a predetermined spatial period, the apparatus comprising:
   (a) a light source emitting a linearly polarized light beam that is at least partially coherent;
   (b) a polarization converter configured to periodically modulate the polarization of said light beam along a single axis to generate a polarization modulation pattern, the polarization converter having an optical axis modulation period that is twice larger than the predetermined spatial period of said spatially periodic orientation modulation of anisotropy axis of the photoresponsive material layer, said polarization converter comprises at least one diffractive waveplate that is achromatic and is part of an array of diffractive waveplates and provides diffraction efficiency greater than 95% over an area greater than 1" in diameter, and scattering losses less than 1%;
   (c) a photoresponsive material having an absorption spectrum that comprises wavelengths of said light beam and an anisotropy axis that is formed or aligned according to polarization of said light beam;
   (d) means for holding and positioning a layer of said photoresponsive material;
   (e) means for positioning and projecting the polarization modulation pattern onto at least a portion of said photoresponsive material layer;
   (f) means for exposing different areas of said photoresponsive material layer to said polarization modulation pattern at an exposure energy density optimized for producing alignment of the anisotropy axis of the photoresponsive material layer at a predetermined spatial period without causing degradation of said photoresponsive material, said exposure energy density exceeding at least 5 times the exposure energy density sufficient for producing waveplates with homogeneous orientation of the optical axis whereby solely the anisotropy axis in said photoresponsive material is aligned according to the polarization modulation pattern of the polarization converter.

7. The apparatus of claim 6 wherein the means for holding and positioning the layer of said photoresponsive material include at least one of the following: a glass substrate; a polymer substrate, a drum, a translation stage, and a rotation stage.

8. The apparatus as in claim 6 wherein the means for exposing different areas of said photoresponsive material layer to said polarization modulation pattern includes at least one of the mechanical motions, translation in the direction perpendicular to the polarization modulation axis, and rotation, said motions performed with the aid of at least one of said positioning means: the positioning means of the holder of said photoresponsive material layer, and the positioning means of said polarization modulation pattern.

9. The apparatus as in claim 6 further comprising at least one anisotropic material layer with an optical axis modulation according to and under the influence of the anisotropy axis of the photoresponsive material layer.

10. The apparatus as claimed in claim 6 wherein said diffractive waveplate comprises at least one cycloidal waveplate.

* * * * *